United States Patent [19]
Buhler et al.

[11] Patent Number: 5,465,264
[45] Date of Patent: Nov. 7, 1995

[54] ELECTRONIC SIMULATION FOR COMPENSATING LASER DIODE THERMAL EFFECTS

[75] Inventors: Steven A. Buhler, Redondo Beach; Ellis D. Harris, Claremont, both of Calif.

[73] Assignee: Xerox Corporation, Stamford, Conn.

[21] Appl. No.: 155,323

[22] Filed: Nov. 22, 1993

[51] Int. Cl.$^6$ ........................................... H01S 3/10
[52] U.S. Cl. ................................ 372/31; 372/33; 372/34; 372/38
[58] Field of Search ................................ 372/31, 38, 29, 372/34, 33

[56] References Cited

U.S. PATENT DOCUMENTS 5,309,458  5/1994  Carl ........................................... 372/31

Primary Examiner—James W. Davie
Attorney, Agent, or Firm—Nola Mae McBain

[57] ABSTRACT

An electronic compensation circuit in which a simulation of a laser's thermal droop characteristics is used to adjust input to the laser and thereby compensate for the laser's thermal droop effects. The simulation circuit is connected to the laser either as an open loop circuit to provide a once only correction or as a closed loop feedback circuit to provide a continuous correction of the laser droop effects. The simulation circuit is designed using either analog or digital circuitry and is adjustable to provide compensation for lasers having different time constants of droop or different values of droop.

13 Claims, 9 Drawing Sheets

ELECTRONIC SIMULATION FOR COMPENSATING LASER DIODE THERMAL EFFECTS

BACKGROUND

This invention relates generally to laser diodes and more particularly concerns an electronic simulation in which thermal effects are modeled and used for correcting laser diode output.

A single beam laser diode assembly has a single diode and usually, in a scanning system, the diode is driven by a train of image pixel information. The pixel information is used to drive the diode and therefore stimulate laser flux emission where there is a white pixel in a write white system. In a write white system, a laser is turned on to create white space on a page. Intensity of the light beam is directly proportional to the output power of the laser. In order to keep the output power of the diode constant, the temperature of the diode should be kept at a constant level. However, due to the structure of the laser diode assembly, as the pixels change, the temperature of the diode fluctuates, which in turn causes the output power of the diode and the intensity of the light beam to fluctuate.

A multiple beam diode assembly has at least two diodes in close proximity on a common substrate. Each diode is driven by a separate train of image pixel information. Again, as the pixels change, the temperature of each diode fluctuates. However, in a multiple diode system, the changing temperature of a diode also causes a temperature fluctuation in adjacent diodes. The temperature fluctuations of the adjacent diodes cause the output power and the intensity of the light beams in those adjacent diodes also to fluctuate.

A tri-level system may use one or more diodes with at least one diode operating at full on, full off, and partially on. One example of an application using a single diode tri-level system is the printing of black and white documents with a highlight color. Tri-level systems suffer from the same heating effects both in the full on and the partially on modes of the laser.

In a printing system fluctuation in the intensity of light beams causes fluctuation in the size of a printed pixel. As the intensity of the light beam decreases, so does the pixel size.

In FIG. 1, the intensity variation in a diode over time is shown due to heating and cooling effects. To illustrate the effect, a first laser beam 10 is left turned on while a second laser beam 12 from an adjacent laser is cycled from a full on position to a full off position using a step function. While the second laser beam 12 is on, heating effects on the first beam 10 cause the intensity to drift downward and finally stabilize at a lower value. The change in intensity is the drift $d_c$. A similar curve is produced from self-heating effects in the second laser 12 when it is turned on. The self-heating effects are seen in the falling time constant $t_{fs}$. The rising time constant $t_{rc}$ or the falling time constant $t_{fc}$ when compared to falling time constant $t_{fs}$, produced from self-heating, is larger. When the laser beam 12 has settled after self-heating effects, the difference in the output intensity is the drift $d_s$. When the drift $d_c$ is compared to the drift $d_s$, the drift $d_c$ is smaller than the drift $d_s$.

When the second laser beam 12 is turned off the heat dissipates. As the heat dissipates, the intensity of the first beam 10 drifts upward and stabilizes at a higher value. The amount the intensity changes is the intensity drift $d_c$. The amount of time needed for the intensity to drift and stabilize is a rising time constant $t_{rc}$. When measured practically, rising time constant $t_{rc}$ and falling time constant $t_{fc}$ are nearly the same. This is important in designing a simulator since both the rising time constant $t_{rc}$ and falling time constant $t_{fc}$ can then be adequately modeled using a single circuit for both. A more accurate but more complicated circuit could be built to model the rising time constant $t_{rc}$ and the falling time constant $t_{fc}$ independently of each other.

Large drifts are visible in printed pages. In FIG. 2, an enlargement of a half tone pattern that illustrates the problem is shown. The pattern consists of six scan lines s1–s6 of alternating light and dark areas. For simplicity, it will be assumed that a single diode assembly in a write white system was used to scan each of the six scan lines s1–s6 sequentially starting with scan line s1 and progressing through scan line s6. However, similar problems and effects occur in write black systems, multiple diode assemblies and tri-level systems. FIG. 2 shows the half tone pattern when it is correctly printed with no heating effects. Scan lines s1 and s5 are all black. Scan lines s2, s3, and s6 are alternating blocks of black and white. Scan line s4 is all white. In a write white system, the laser is turned on to create white space and turned off to create black space. Rectangle R1 is the first white rectangle printed on scan line s2.

FIG. 3 is the pattern shown in FIG. 2 when it is printed with a single laser diode experiencing self-heating effects. When scanning scan line s1 a laser remains off the entire time since the entire line is black. When scanning scan line s2, the laser starts scanning in the off position but shortly turns on when it enters rectangle R1. When the laser turns on, the spot intensity is at its peak and gradually diminishes and stabilizes as shown in FIG. 1. The resulting change in spot size from large to small will create sloping edges E on rectangle R1. Every time the laser turns on, the same sloping edges E will be produced until the intensity and spot size stabilize.

Similar effects can be seen in multiple laser assemblies, tri-level systems and write black systems. In multiple laser assemblies, the deviations are caused from heating effects from adjacent lasers as well as the writing laser. In tri-level systems heating effects occur at both the full on and the intermediate on states.

Minimizing heating effects or otherwise compensating for or correcting for them would result in more accurate printed pages with improved image quality.

One method for compensating for laser drift would be to use a direct, real time feedback system. However, direct feedback systems have the disadvantages of being very expensive to construct, requiring extremely fast components to effectively calculate and provide a real time corrective signal, and requiring additional light paths in the printing system. Therefore, some other method must be found. The present invention uses the idea that laser drift can be modeled accurately enough to generate an appropriate correction signal.

When the pattern dependent laser drive signal is presented to both the laser diode and its model then the laser drift can be computed using the model. The correction of the laser drift can then be implemented and presented to the model to observe the correction effects. The important requirement is to make a model which faithfully models the physics of the actual heating effects of the laser.

A compensation method based on a simulation of the laser heating effects has the advantages of being inexpensive and reliable while requiring no additional light paths and being easy to install and adapt to many different printing systems.

Accordingly, it is the primary aim of the invention to provide a method for compensating for a variety of thermally induced effects. Further advantages of the invention will become apparent as the following description proceeds.

SUMMARY OF THE INVENTION

Briefly stated and in accordance with the present invention, there is provided a laser system comprising a laser, a simulator for simulating laser thermal effects and generating a compensating signal, a base level gain control signal for driving said laser, an adder for combining said base level gain control signal and the compensating signal to generate a laser driving signal, and the laser being operated by the laser driving signal.

While the present invention will be described in connection with a laser being used in a printing system, it will be understood that it is not intended to limit the invention to printing systems. On the contrary, it is intended to cover all alternatives, modifications and equivalents as may be included within the spirit and scope of the invention as defined by the appended claims.

DETAILED DESCRIPTION OF THE INVENTION

Figure 4:
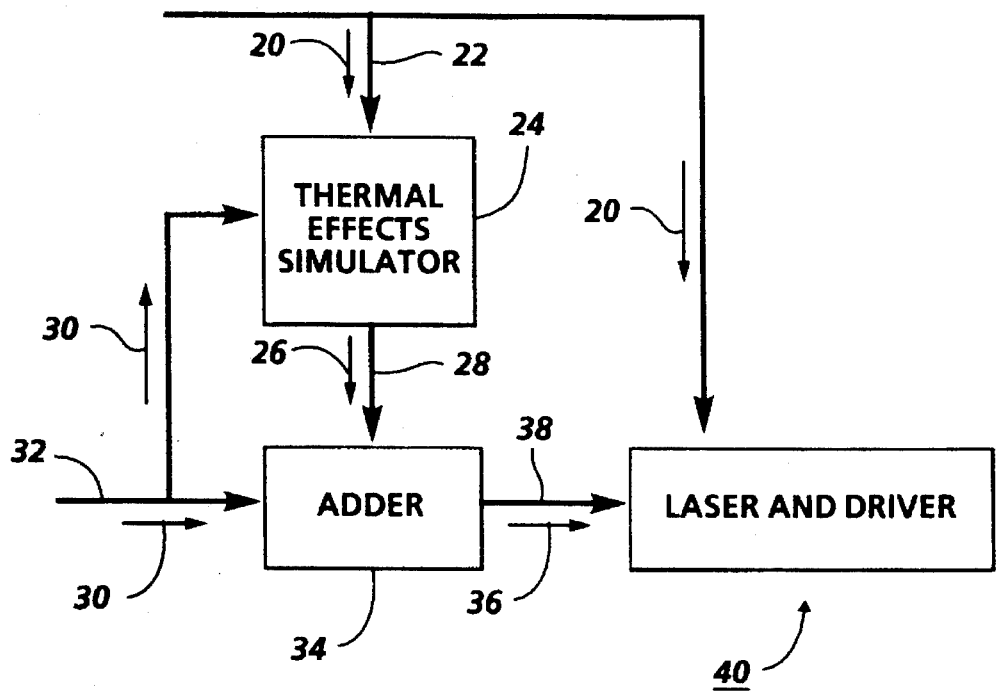
FIG. 4 is a block diagram of a laser compensatin circuit for a single laser.

Turning now to FIG. 4, video data input signal 20 on line 22 is applied to a thermal effects simulator 24. Also applied to the thermal effects simulator 24 is the automatic gain control signal 30 on line 32. The automatic gain control signal 30 adjusts to control the light laser 40 due to long term effects such as aging of the photoreceptor. Next, the video data input signal 20 is used to activate a switch which turns a laser 40 on or off according to the desired printed pattern.

In the write white example, the video data input signal 20 becomes positive corresponding to white space on a printed page and the laser 40 is turned on. The thermal effects simulator 24 responds to the video data input signal 20 and the automatic gain control signal 30 by outputting a signal linearly proportional to the automatic gain control signal 30 when modulated by the effects of simulated temperature rise. The new signal transmitted by the thermal effects simulator 24 is the thermal effects correction signal 26 on line 28 and is used to compensate for thermal droop effects.

The thermal effects correction signal 26 and the automatic gain control signal 30 on line 32 are both applied to an adder 34. The automatic gain control signal 30 is determined by photoreceptor sensitivity and other system factors. Since, over time, the photoreceptor becomes less sensitive, the signal must be increased to increase the laser 40 output. A laser control signal 36 on line 38 is emitted by an adder 34 to be applied to laser 40. The laser control signal 36 contains both the thermal effects correction signal 26, to correct for thermal effects, and the automatic gain control signal 30, to correct for photoreceptor aging effects.

Figure 1:
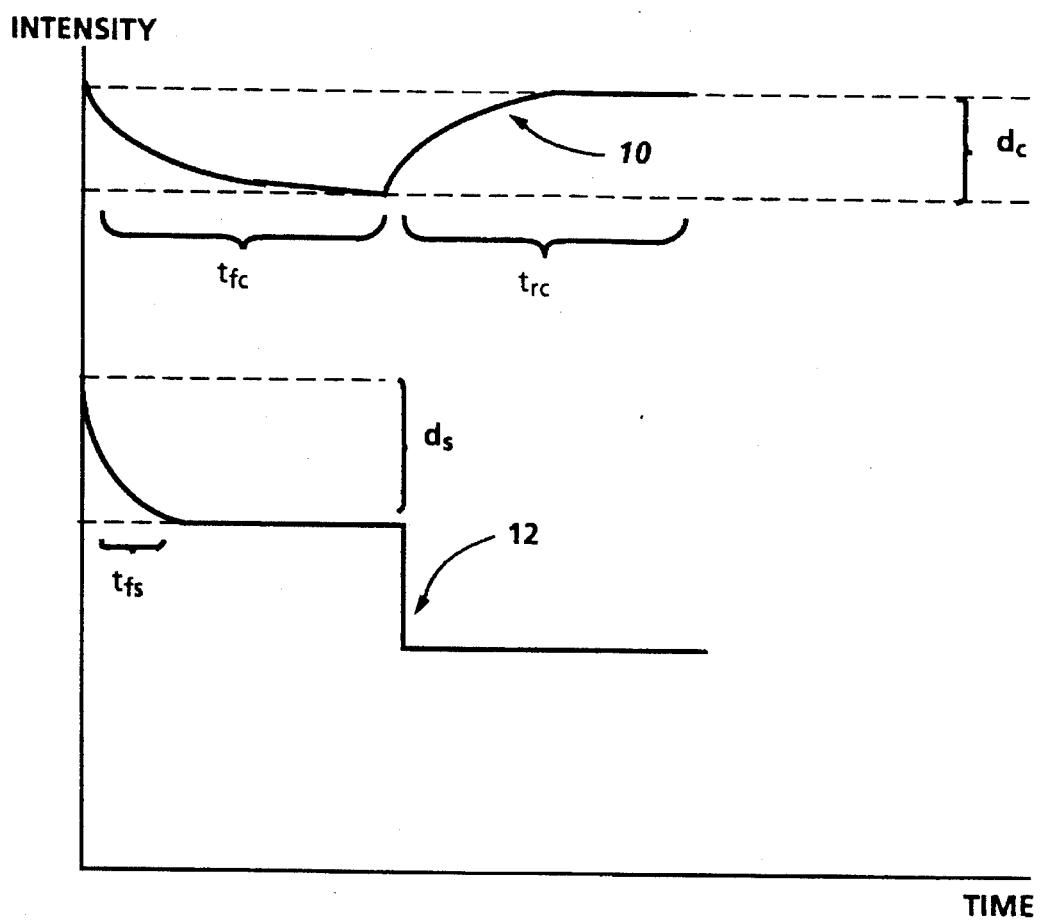
FIG. 1 is a graph of a laser ouput intensity as it varies due to laser drift.
Figure 2:
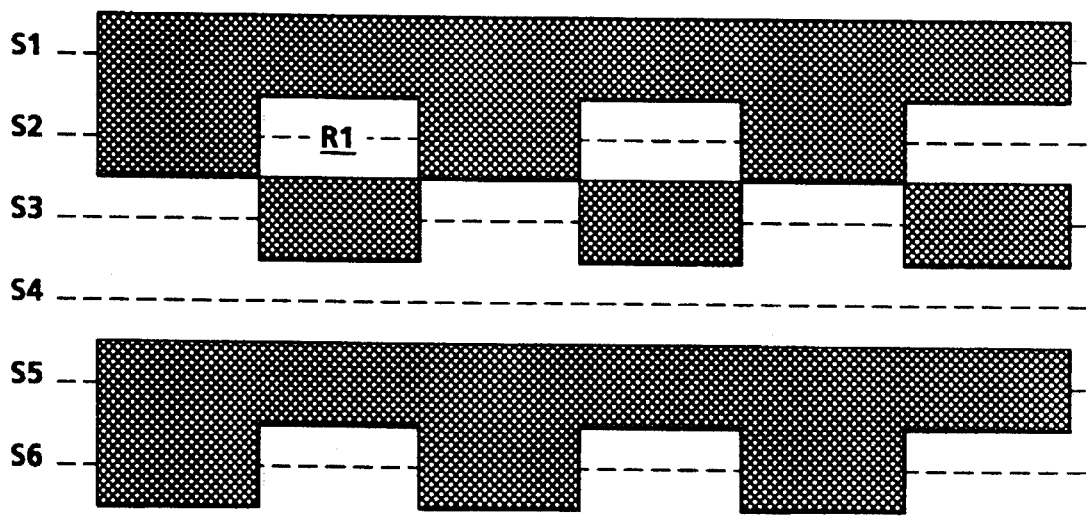
FIG. 2 is an enlargement of a pixel pattern.
Figure 3:
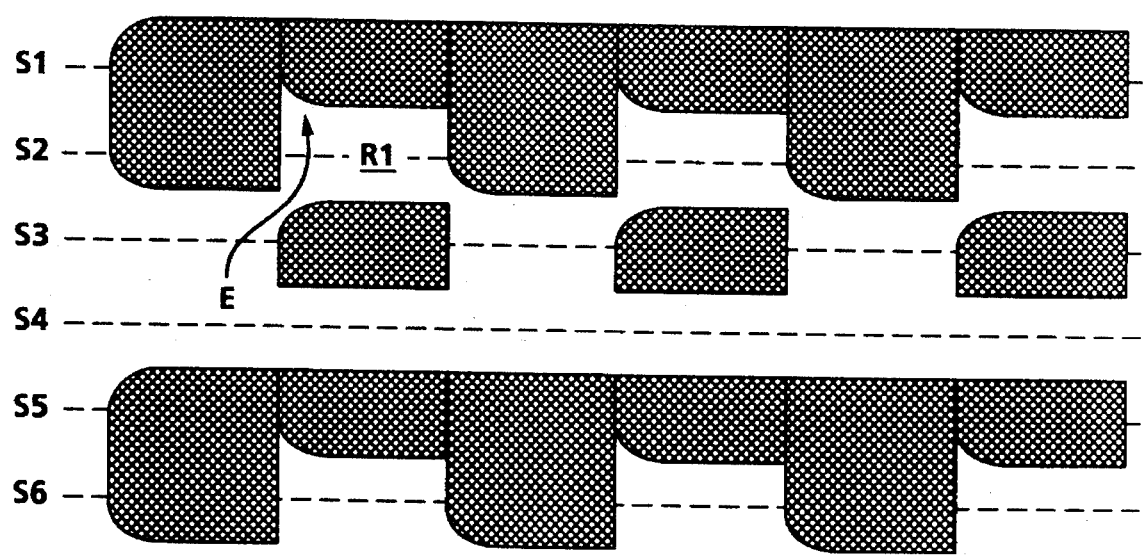
FIG. 3 is an enlargement of a pixel pattern affected by laser drift.

The thermal effects simulator 24 contains circuitry which appropriately simulates laser droop and generates a correction signal. The simulator is programmed or implemented with a standard time constant. Using the falling time constant $t_{fs}$, the thermal effects simulator 24 can compensate for the drift $d_s$ in intensity (as shown in FIG. 1) by increasing the thermal effects correction signal 26. The increased thermal effects correction signal 26 will cause an increase in intensity of the laser.

The circuit in FIG. 4 applies a first order corrective increase in the current to compensate for a downward drift in laser intensity. The laser will respond to the increased current by increasing its ouput, which will also generate more heat causing additional thermal effects.

Figure 5:
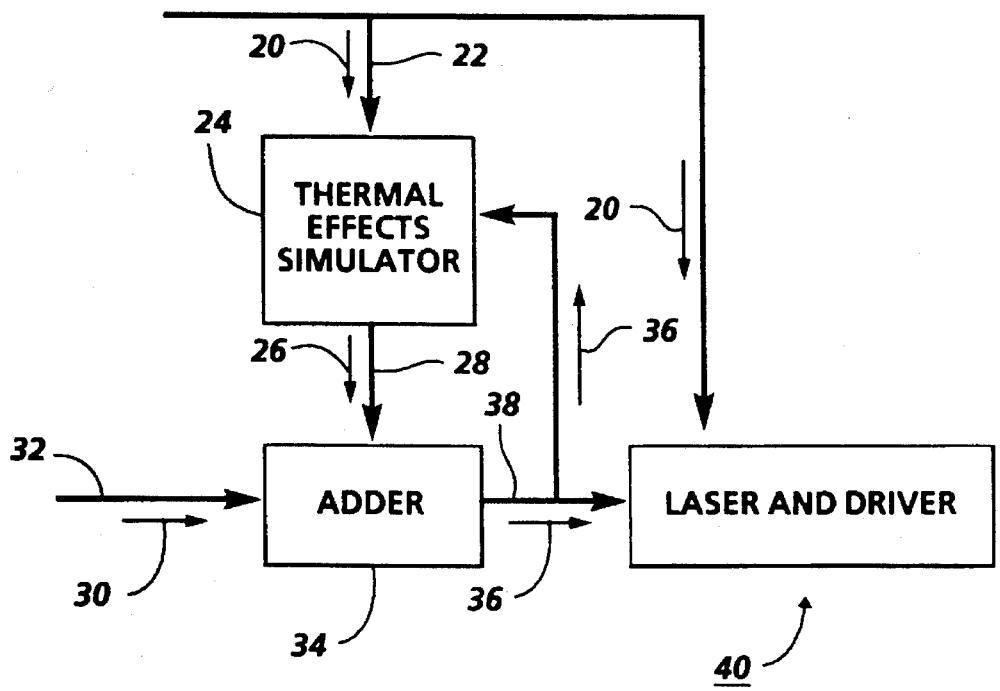
FIG. 5 is a block diagram of a laser compensatin circuit for a single laser.

A circuit shown in FIG. 5, can be used to compensate for higher order thermal effects. In the circuit shown in FIG. 5, the laser control signal 36 is applied to the thermal effects simulator 24 rather than the automatic gain control signal 30. When the video data input signal 20 is first turned on the laser control signal 36 is equal to the automatic gain control signal 30 and the thermal effects correction signal 26 is equal to zero. As the thermal effects simulator 24 responds, the thermal effects correction signal 26 rises and is added to the automatic gain control signal 30 to form the laser control signal 36. As the laser control signal 36 rises, it is fed back to the thermal effects simulator 24 which can then increase the thermal effects correction signal 26 further to compensate for the additional thermal effects.

Figure 6:
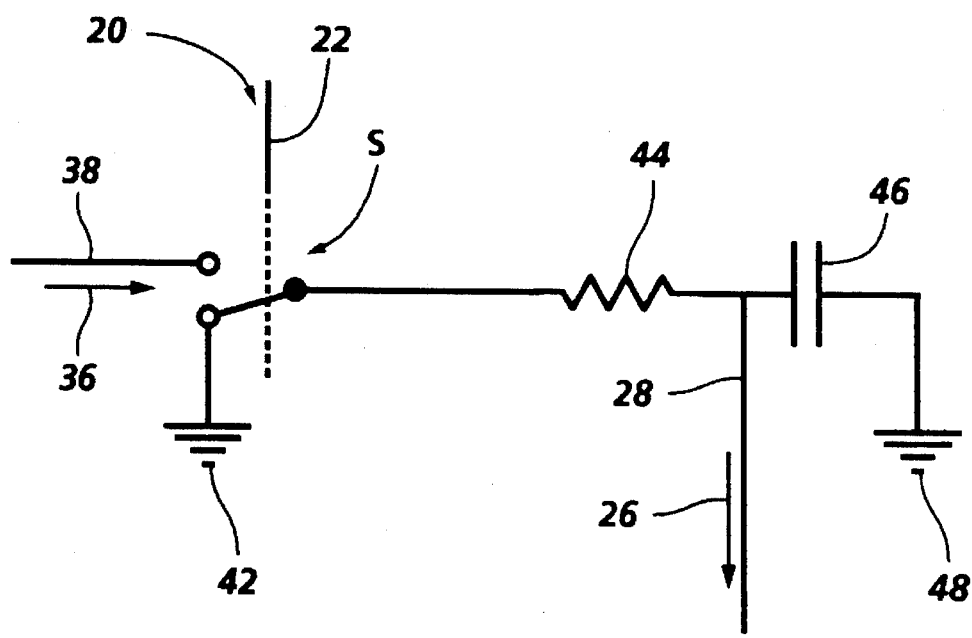
FIG. 6 is a schematic of a laser drift simulation circuit before activation.

In its simplest form, the circuitry inside the thermal effects simulator 24, shown in FIGS. 4–5, is shown in FIG. 6. The video data input signal 20 on line 22 is connected directly to a two pole switch S that switches between the laser control signal 36 on line 38 or the automatic gain control signal 30 on line 32 and ground 42. In FIG. 6, the two pole switch S is shown connected to ground 42. The thermal effects correction signal 26 and one side of a capacitor 46 are then connected to ground 42 through the resistor 44. The other side of the capacitor 46 is always connected to ground 48. The thermal effects correction signal 26 is zero since it is pulled to ground 42.

Figure 7:
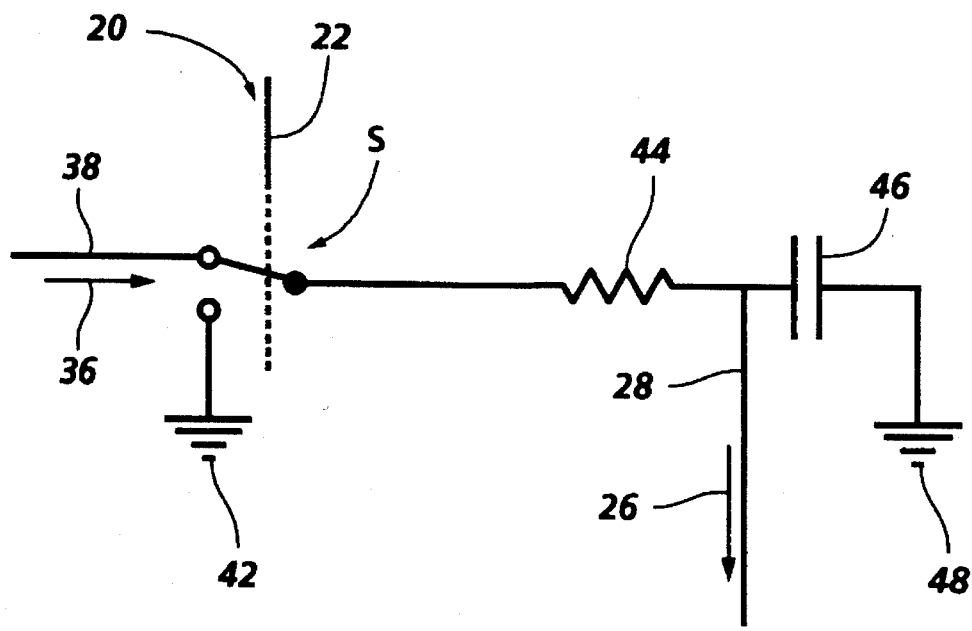
FIG. 7 is a schematic of a laser drift simulation circuit after activation.

FIG. 7 shows the identical circuit with the two pole switch S connected to the laser control signal 36. This happens when the video data input signal 20 goes high (in our write white system). The thermal effects correction signal 26 is now connected to the laser control signal 36 through the RC circuit consisting of the resistor 44 and the capacitor 46. The values of the resistor 44 and the capacitor 46 are chosen to produce a time constant for the RC circuit that is equivalent to the falling time constant $t_{fs}$ shown in FIG. 1. As the capacitor 46 charges, a small signal that is proportional to the laser control signal 36 on line 38, appears on line 28. This signal is the thermal effects correction signal 26 and is described by the equation $I=Ae^{(-t/RC)}$ where:

A=an arbitrary constant, and e=the base for natural logarithms approximately equal to 2.71828, and the elements in the exponent:

t=time constant of the circuit,

R=resistance of the circuit, and

C=capacitance of the circuit.

Figure 8:
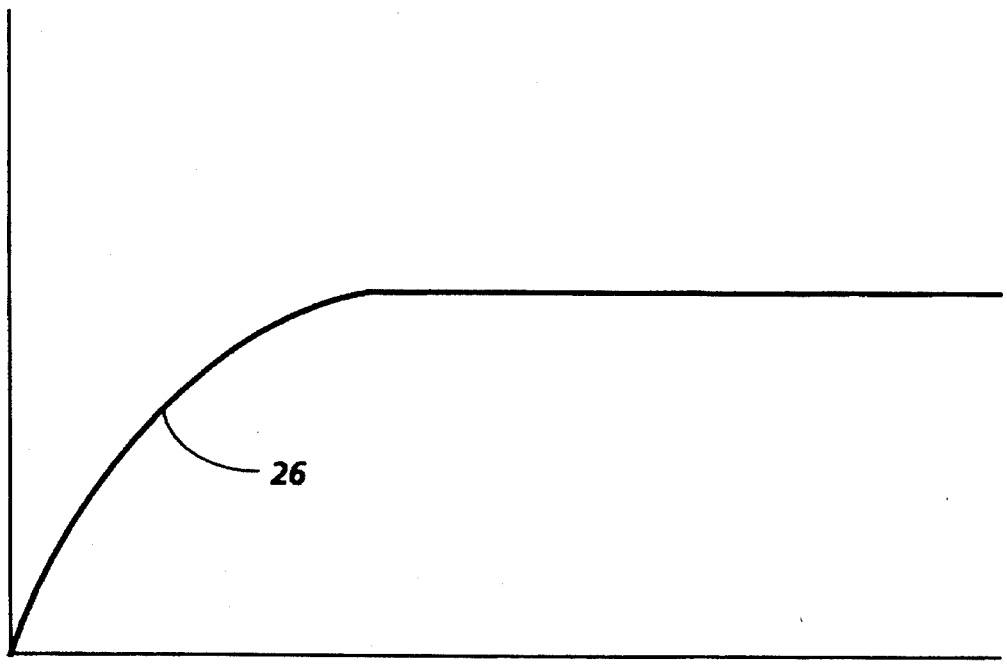
FIG. 8 is a graph of the output of the laser drift simulation circuit shown in FIG. 7.

FIG. 8 shows this signal, on a graph over time. Referring to FIG. 8, the thermal effects correction signal 26 starts at a value of zero, as the capacitor 46 charges, the signal slowly starts to rise and finally levels off.

Figure 9:
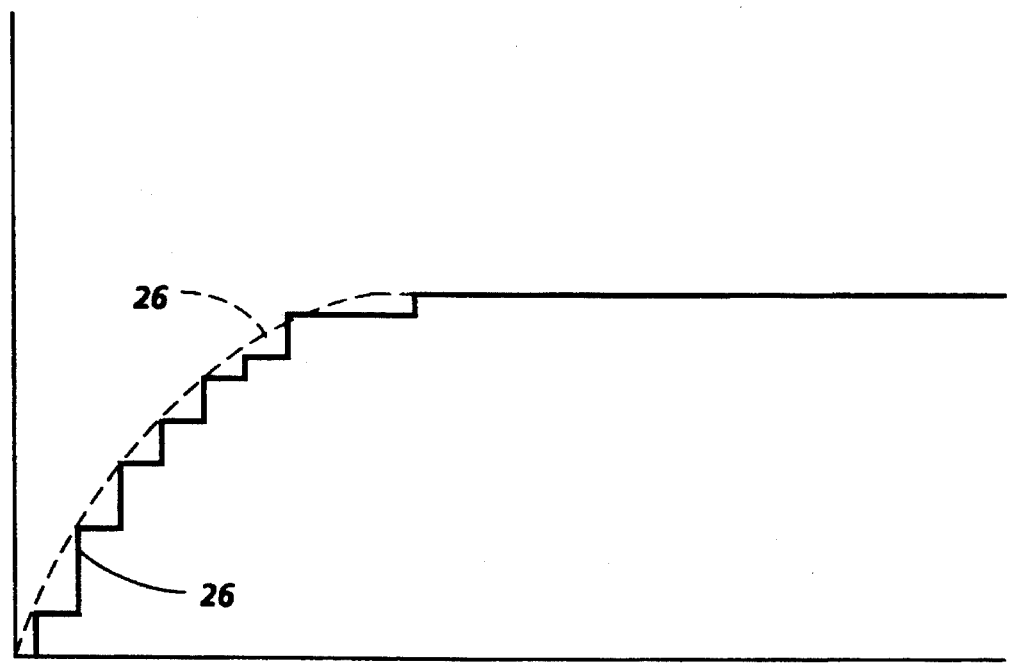
FIG. 9 is a graph of the output of a digital laser drift simulation.

There are many ways, known in the art, to create the thermal effects correction signal 26 shown in FIG. 8. The RC circuit could be replaced with an equivalent RL circuit, multiple RC or RL circuits, or any combination thereof, as known in the art. Alternatively, the signal could be approximated digitally, using a miroprocessor, ROM, RAM, or other digital circuit, as known in the art, as shown in FIG. 9. For comparison, in FIG. 9, the ideal thermal effects correction signal 26 is shown as a fine dotted line while the actual thermal effects correction signal 26 is shown as a solid line.

This approach works well provided that the falling time constant $t_{fs}$ (shown in FIG. 1) and the drift $d_s$ (shown in FIG. 1) are known. However, these values differ in different lasers. Therefore, modifications to the circuit shown in FIG. 6 are shown in FIGS. 10–11 to compensate for these variations.

Figure 10:
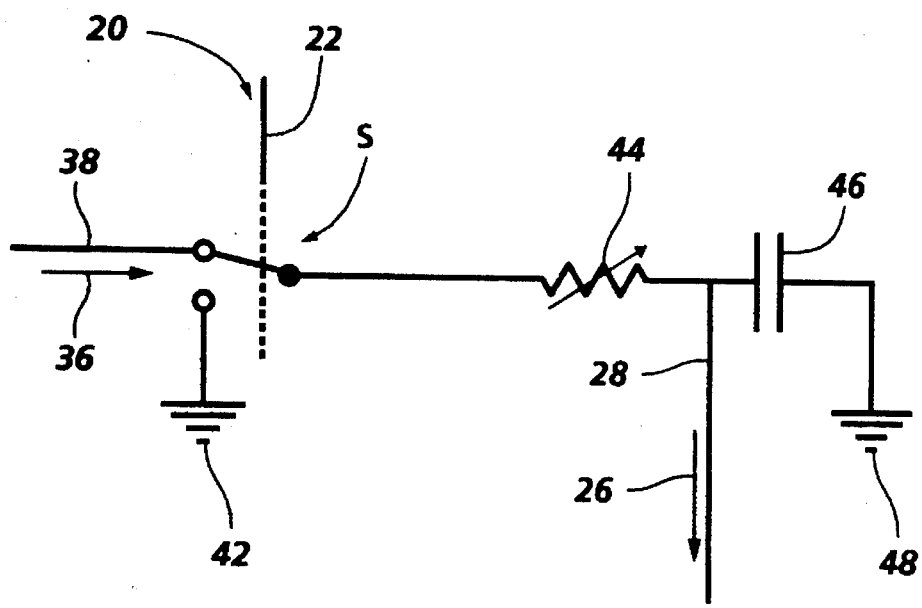
FIG. 10 is a schematic of an adjustable laser drift simulation circuit.

In FIG. 10 the resistor 44 has been replaced with a variable resistor 44. Since this resistor 44 sets the value of the time constant of the RC circuit to be equal to the time constant $t_{fs}$ of the circuit, changing this resistor provides adjustability in the RC circuit. The time constant of the RC circuit can be adjusted by varying the value of the resistor 44 to match the time constant $t_{fs}$ of the laser. This adjustment of resistor 44 is equivalent to adjusting the "R" term in the exponent of the equation $I=Ae^{(-t/RC)}$.

Figure 11:
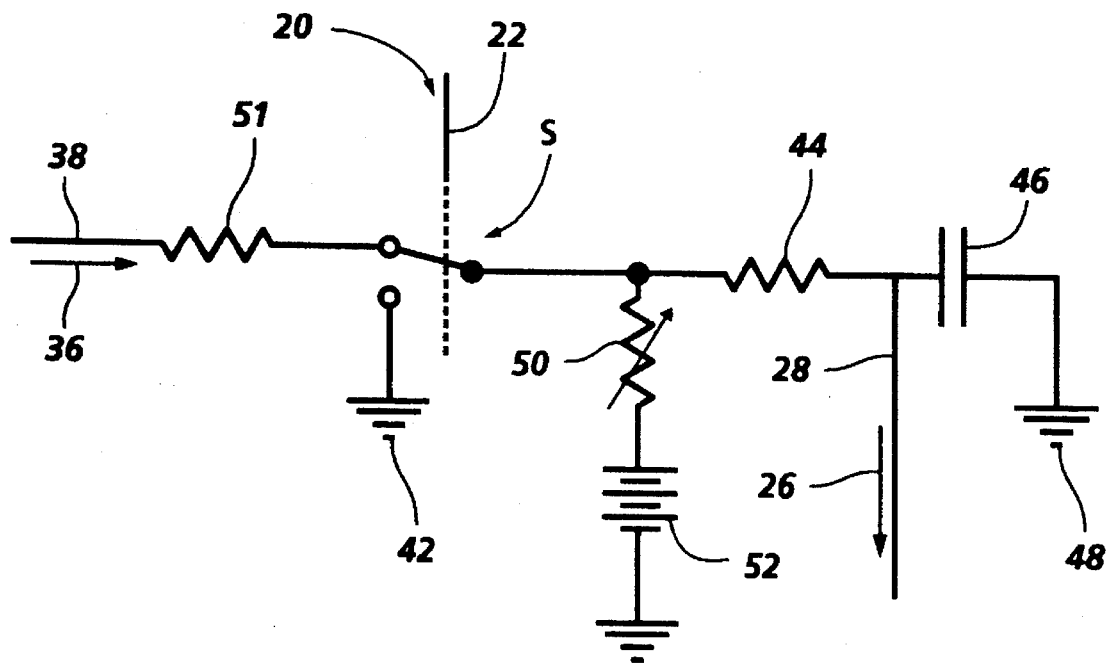
FIG. 11 is a schematic of an adjustable laser drift simulation circuit.

In FIG. 11, a variable resistor 50, has been connected to the two pole switch S between the two pole switch S and the resistor 44 at node 45. The other end of the resistor 50 is shown connected to a voltage source 52. The resistor 50 affects the offset adjustment of the thermal effects correction signal 26. By changing the value of the resistor 50 the offset adjustment can be set. Resistor 51 has been added between to receive laser control signal 36 prior to two pole switch S to insure correct operation of resistor 50 to provide a voltage change at node 45 when it is adjusted. Offset adjustment is used since laser output is not directly proportional to laser input current. The offset adjustment then adds an appropriate amount of current to achieve the desired laser output. The addition of resistor 50 is equivalent to adding a new term "B" to the current equation to produce a new equation $I=Ae^{(-t/RC)}+B$ where B=an offset voltage.

Figure 12:
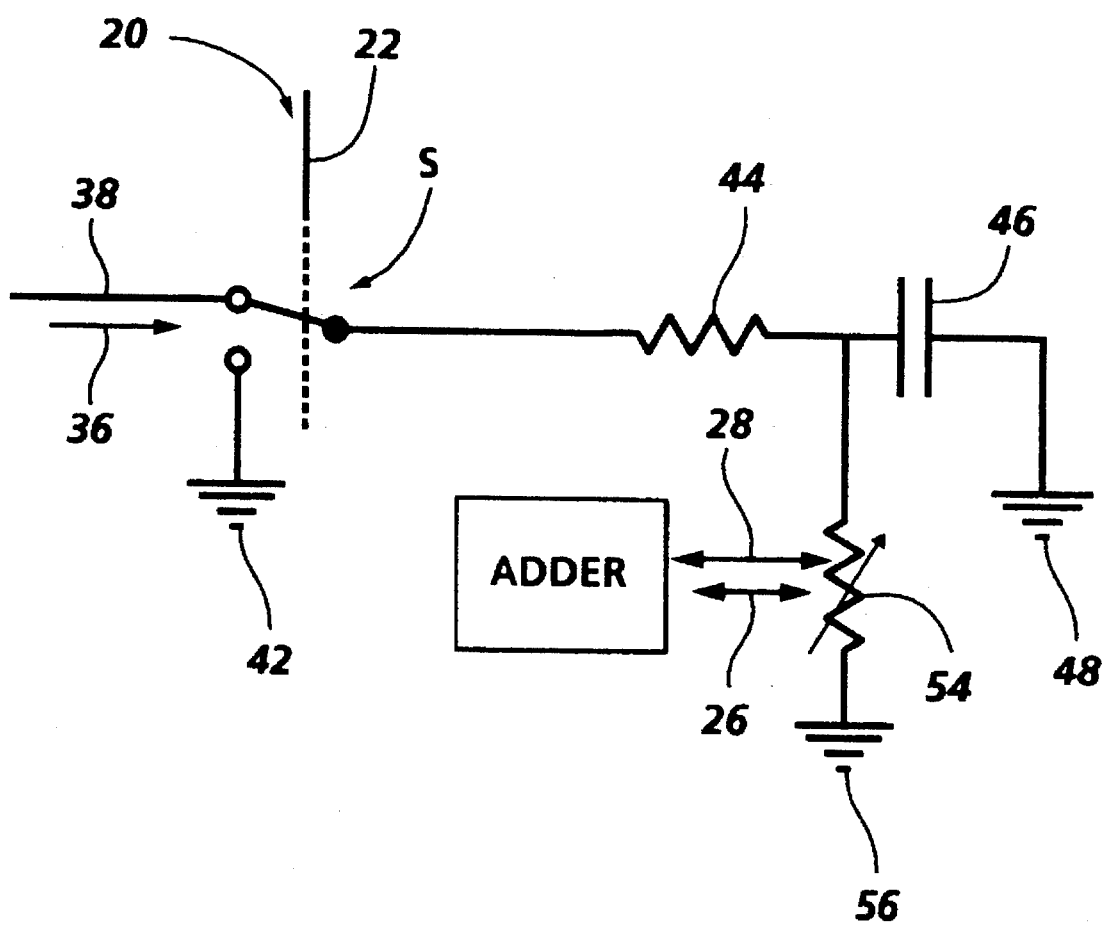
FIG. 12 is a schematic of an adjustable laser drift simulation circuit.

In FIG. 12, an additional variable resistor 54 is shown connected between the thermal effects correction signal 26 on line 28 and the junction between resistor 44 and capacitor 46. Variable resistor 54 is bidirectionally connected to the adder 34 through the thermal effects correction signal 26 on line 28. The other end of the variable resistor 54 is connected to ground 56. The resistor 54 affects the scaling factor used to create the thermal effects correction signal 26. By changing the value of the resistor 50 the scaling factor can be adjusted. The adjustment of variable resistor 54 is equivalent to adjusting the "A" term in the equation $I=Ae^{(-t/RC)}$.

This circuit has been greatly simplified for clarity of explanation. It must be remembered that standard design techniques should be used when designing the actual circuit. For example, the two pole switch S may be implemented using a multiplier, and outputs should be adequately buffered to avoid an undue load on individual points in the circuit.

Figure 13:
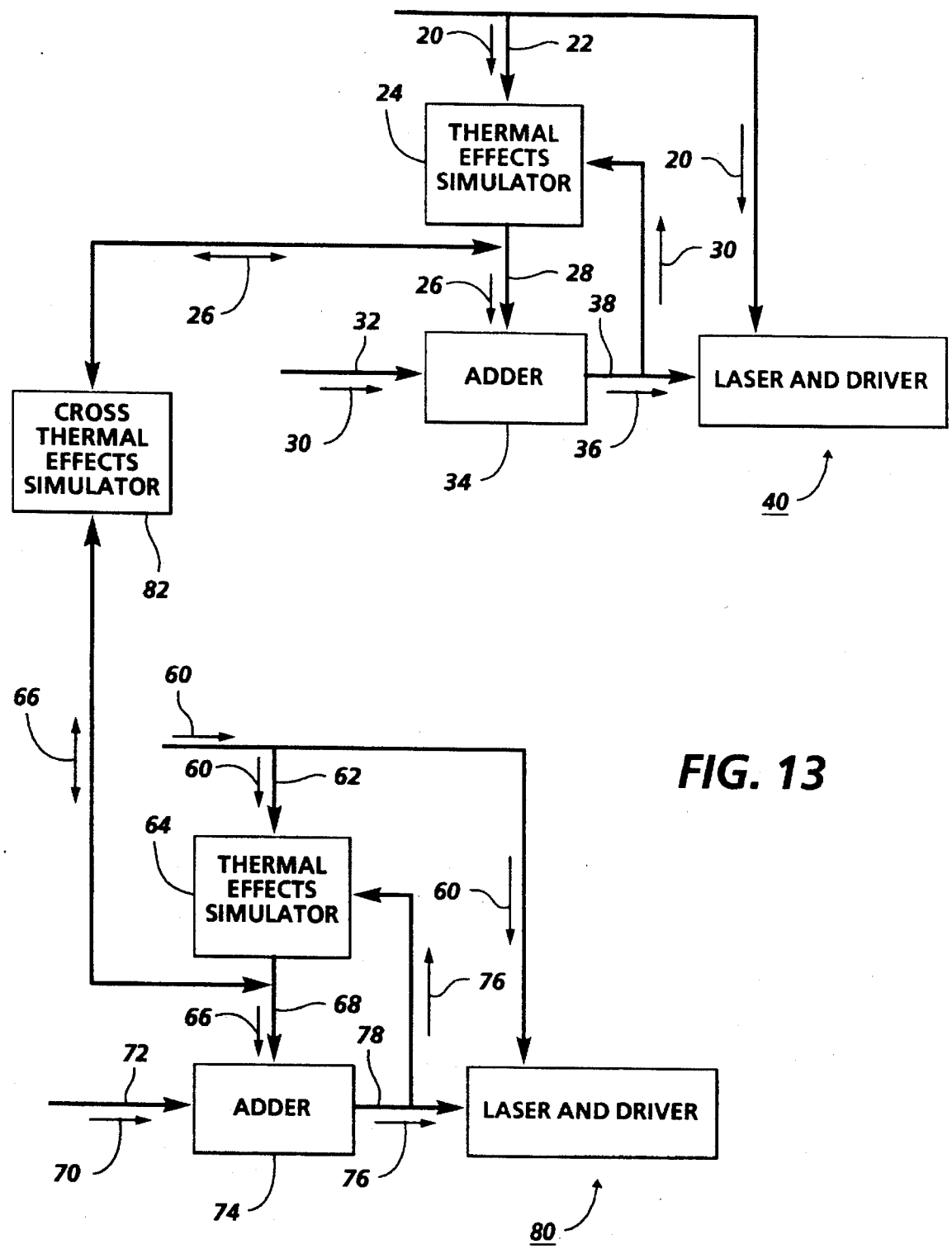
FIG. 13 is a block diagram of a laser compensatin circuit for a dual laser system.

Thus far, circuitry to compensate for self-heating effects have been shown. In FIG. 13 a circuit to compensate for cross heating effects is shown. The thermal effects simulators 24, 64 of two adjacent laser systems are bidirectionaily connected to a third cross thermal effects simulator 82, designed to compensate for cross thermal effects, through the thermal effects correction signals 26, 66. Each laser system is comprised of a video data input signal 20, 60 which is fed to its respective thermal effects simulator 24, 64 on line 22, 62 and a laser and driver assembly 40, 80. The thermal effects simulators 24, 64 also receive input from its respective laser control signals 36, 76 on lines 38, 78. The thermal effects simulators 24, 64 then produce thermal effects correction signals 26, 66 on lines 28, 68 which is sent to adders 34, 74 to be combined with automatic gain control signals 30, 70 in adders 34,74. The adders 34,74 produce laser control signals 36, 76 which controls the lasers in the laser and driver assemblies 40, 80, respectively. The resultant correction current will have the same shape as the curve shown in FIG. 8.

Figure 14:
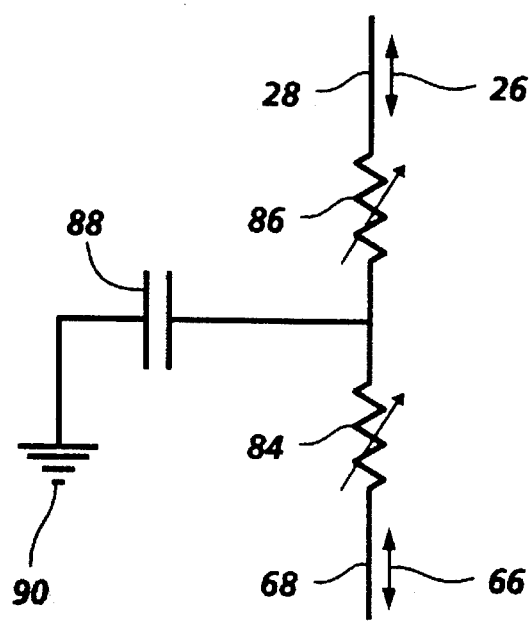
FIG. 14 is a schematic of an adjustable laser drift simulation circuit used in FIG. 13.

FIG. 14 illustrates a simple version of the circuit inside the thermal effects simulator 82. Two series resistors 84, 86 are connected to the bidirectional outputs of the thermal effects simulator 82. A capacitor 88 is connected to ground 90 on one end and between the two series resistors 84, 86 on the other end. Resistor 86 is used to set a time constant for one assembly and resistor 84 is used to set a time constant for the other assembly. Since both resistors 84, 86 are variable resistors then the time constants can be adjusted by varying the resistance.

Figure 15:
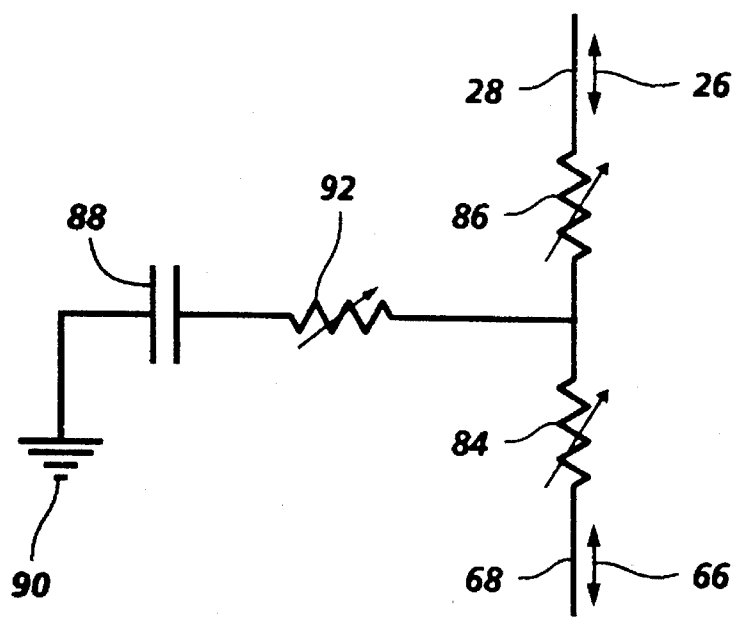
FIG. 15 is a schematic of an adjustable laser drift simulation circuit used in FIG. 13.

FIG. 15 shows a variation of FIG. 14. Resistor 92 is added between capacitor 88 and the junction of resistor 86 and resistor 84 to provide better tunability of time constants.

Again, there are many ways, known in the art, to create the thermal effects correction signal 26 shown in FIG. 14. The RC circuit could be replaced with an equivalent LC circuit, as known in the art, or the signal could be approximated digitally, using a miroprocessor, ROM, RAM, or other digital circuit, as known in the art.

We claim:

1. A laser with intensity control comprising:
   a) a laser
   b) simulator means for simulating laser thermal effects and generating a compensating signal in accordance with the simulated laser thermal effects which comprises,
      i) a control means for receiving a control signal;
      ii) an input means for receiving an input signal;
      iii) a current generating means for generating said compensating signal operably connected and responsive to said input means for generating said compensation signal from the input signal, said current generating means also operably connected and responsive to said control means to only generate said compensating signal when said control means has received the control signal; and iv) an output means operably connected and responsive to said current generating means for transmitting said compensating signal, and v) said compensating signal is approximately described by the equation $I=Ae^{(-t/rc)}+B$ wherein:
A=a first constant,
B=a second constant describing an offset voltage, and
e=the base for natural logarithms approximately equal to 2.71828, and for the elements in the exponent:
t=time constant of the circuit,
R=resistance of the circuit, and
C=capacitance of the circuit, c) a base level gain control signal for driving said laser connected to said simulator input means, d) adding means operatively connected to said base level gain control signal and the compensating signal for combining said base level gain control signal and the compensating signal to generate a laser driving signal for controlling the intensity of the laser, said laser driving signal also being connected to said simulator input means, and e) said laser being operatively connected to the laser driving signal.

2. The laser of claim 1 wherein said current generating means is a circuit comprising at least:

a) a first resistor with first resistor first end and a first resistor second end, b) a capacitor with first capacitor end and a second capacitor end, c) said first resistor so arranged and constructed to be electrically connected to said control means such that said first resistor is electrically connected to said control means on the first resistor first end, d) said capacitor so arranged and constructed to be electrically connected on the first capacitor end to said first resistor on the first resistor second end, e) said capacitor connected to ground on the second capacitor end, a second resistor with a second resistor first end and a second resistor second end, g) said second resistor so arranged and constructed to be electrically connected to said control means such that said second resistor is electrically connected to said control means on the second resistor first end, h) a voltage source so arranged and constructed to be electrically connected to said second resistor on the second resistor second end, and i) said output means is connected at a junction of the first resistor second end with the first capacitor end.

3. The laser of claim 1 wherein said current generating means is a circuit comprising at least:

a) a resistor and an inductor;

b) said resistor and said inductor being so constructed and arranged to generate an increasing current signal approximately described by said equation $I=Ae^{(-t/rc)}+B$.

4. The laser of claim 1 wherein said current generating means is a microprocessor so constructed and arranged to generate an increasing current signal approximately described by the equation $I=Ae^{(-t/rc)}+B$.

5. The laser of claim 1 wherein said current generating means is a Random Access Memory (RAM) so constructed and arranged to generate an increasing current signal approximately described by said equation $I=Ae^{(-t/rc)}+B$.

6. The laser of claim 1 wherein said current generating means is a Read Only Memory (ROM) so constructed and arranged to generate an increasing current signal approximately described by said equation $I=Ae^{(-t/rc)}+B$.

7. The laser of claim 2 wherein said first resistor is a variable resistor.

8. The laser of claim 2 wherein said second resistor is a variable resistor.

9. The laser of claim 3 wherein said current generating means includes a third resistor electrically connected on one end at the same connection that said first resistor is connected to said capacitor and electrically connected on the other end to said output means.

10. The laser of claim 9 wherein said third resistor is a variable resistor.

11. A laser system with intensity control comprising:

a) first and second lasers, b) first and second simulator means for respectively simulating first and second laser thermal effects and generating first and second compensating signals respectively in accordance with the first and second simulated laser thermal effects, c) first and second base level gain control signals for respectively driving said first and second lasers, d) first and second adding means operatively connected respectively to said first and second base level gain control signals and the first and second compensating signals for respectively combining said first and second base level gain control signals and the first and second compensating signals to respectively generate first and second laser driving signals for respectively controlling the intensity of the first and second lasers, e) said first and second lasers being respectively operatively connected the first and second laser driving signals, f) a third simulator means for simulating cross laser thermal effects and generating a cross laser compensating signal in accordance with the cross laser simulated thermal effects, and g) said third simulator means being operatively connected to both said first and second adding means.

12. The laser system with intensity control of claim 11 wherein said third simulator means comprises:

a) a first resistor with a first end and a second end, b) a second resistor with a first end and a second end, c) a capacitor with a first end and a second end, d) the first end of said first resistor being operably connected to the first end of said second resistor and the first end of said capacitor, e) the second end of said first resistor being operably connected to said first adding means, f) the second end of said second resistor being operably connected to said second adding means, and g) the second end of said capacitor being operably connected to ground.

13. The laser system with intensity control of claim 11 wherein said third simulator means comprises:

a) a first resistor with a first end and a second end, b) a second resistor with a first end and a second end, c) a third resistor with a first end and a second end, d) a capacitor with a first end and a second end, e) the first end of said first resistor being operably connected to the first end of said second resistor and the first end of said third resistor, f) the second end of said first resistor being operably connected to said first adding means, g) the second end of said second resistor being operably connected to said second adding means, h) the second end of said third resistor being operatively connected to the first end of said capacitor, and g) the second end of said capacitor being operably connected to ground.

* * * * *